United States Patent  
Nagata et al.

(10) Patent No.: US 8,288,011 B2  
(45) Date of Patent: Oct. 16, 2012

(54) ADHESIVELESS COPPER CLAD LAMINATES AND METHOD FOR MANUFACTURING THEREOF

(75) Inventors: Junichi Nagata, Ichikawa (JP); Yoshiyuki Asakawa, Ichikawa (JP)

(73) Assignee: Sumitomo Metal Mining Co., Ltd., Tokyo (JP)

( * ) Notice: Subject to any disclaimer, the term of this patent is extended or adjusted under 35 U.S.C. 154(b) by 0 days.

(21) Appl. No.: 12/805,921

(22) Filed: Aug. 24, 2010

(65) Prior Publication Data

US 2011/0081557 A1 Apr. 7, 2011

Related U.S. Application Data

(63) Continuation of application No. 11/661,307, filed on Feb. 27, 2007, now abandoned.

(30) Foreign Application Priority Data

Sep. 1, 2004 (JP) ................................. 2004-254944

(51) Int. Cl.  
*B32B 15/04* (2006.01)  
*B32B 15/08* (2006.01)  
*B32B 15/20* (2006.01)  
*C23C 14/20* (2006.01)  
*B05D 5/00* (2006.01)  
*B05D 7/00* (2006.01)

(52) U.S. Cl. ........ 428/626; 428/663; 428/675; 428/680; 428/215; 428/336; 428/458; 204/192.15; 427/124; 427/97.1; 427/250; 427/404; 427/294; 427/296

(58) Field of Classification Search .................. 428/606, 428/607, 626, 662, 660, 674, 663, 675, 680, 428/213, 214, 215, 216, 220, 332, 335, 336, 428/457, 458, 461, 473.5, 473.4, 480, 935, 428/937, 938  
See application file for complete search history.

(56) References Cited

U.S. PATENT DOCUMENTS 6,171,714 B1 * 1/2001 Bergkessel et al. ........... 428/618  
* cited by examiner

*Primary Examiner* — Michael La Villa  
(74) *Attorney, Agent, or Firm* — Dykema Gossett PLLC

(57) ABSTRACT

Adhesiveless copper clad laminates wherein a base metal layer is directly formed on at least one side of an insulating film without using an adhesive and a copper conductor layer having a desired thickness is formed on the base metal layer, the adhesiveless copper clad laminates is characterized in that a base metal layer having a thickness of 3 to 50 nm is formed on an insulating film by a dry plating method and a copper film layer is formed on the base metal layer, and the base metal layer mainly contains (1) a vanadium-molybdenum-nickel alloy consisting of 4 to 13% by weight of vanadium, 5 to 40% by weight of molybdenum, and the balance of nickel or (2) a vanadium-chromium-molybdenum-nickel alloy consisting of 4 to 13% by weight of vanadium and chromium in total including at least 2% by weight of vanadium, 5 to 40% by weight of molybdenum, and the balance of nickel.

7 Claims, No Drawings

ADHESIVELESS COPPER CLAD LAMINATES AND METHOD FOR MANUFACTURING THEREOF

CROSS-REFERENCE TO RELATED APPLICATION

This application is a continuation of application Ser. No. 11/661,307 filed Feb. 27, 2007, now abandoned, which was a U.S. national phase filing of PCT/JP2005/015365, filed 24 Aug. 2005, which claimed priority of Japanese Patent Application 2004-254944, filed Sep. 1, 2004. All priorities are claimed

TECHNICAL FIELD

The present invention relates to adhesiveless copper clad laminates and a method for manufacturing thereof, and more particularly to adhesiveless copper clad laminates in which a vanadium-molybdenum-nickel base metal layer or a vanadium-chrome-molybdenum-nickel base metal layer (a seed layer) is formed on an insulating film by a dry plating method and a copper film layer is then formed on the base metal layer, and which has high adhesion and corrosion resistance, and has the copper film layer with high insulation reliability, and to a method for manufacturing thereof.

BACKGROUND ART

In general, substrates used to manufacture flexible wiring substrates are roughly divided into adhesive copper clad laminates in which a copper foil serving as a conductor layer is bonded together on an insulating film by using an adhesive (see, e.g., Patent Document 1), and adhesiveless copper clad laminates in which a copper film layer serving as a conductor layer is directly formed on the insulating film by a dry plating method or a wet plating method without using an adhesive in between.

Here, when using the adhesive copper clad laminates, adhesive flexible wiring substrate can be manufactured by forming a desired wiring pattern on a substrate by a subtractive method and, when using the adhesiveless copper clad laminates, an adhesiveless flexible wiring substrate can be manufactured by forming a desired wiring pattern on a substrate by a subtractive method or an additive method, but use of the adhesive copper clad laminates that can be manufactured by a simple manufacturing method at low cost forms a mainstream in a conventional technology.

Meanwhile, with recent density growth of electronic devices, a wiring substrate whose wiring width pitch is also narrowed has been demanded.

However, in manufacture of adhesive copper clad laminates, when a wiring portion is formed on a copper film layer provided on an insulating film as a substrate by etching in accordance with a desired wiring pattern to manufacture a wiring substrate, so-called side etching that a side surface of the wiring portion is etched occurs, and hence a cross-sectional shape of the wiring portion tends to have a trapezoidal shape spreading toward the bottom.

Therefore, when etching is carried out till electrical insulating properties are assured between wiring portions, a wiring pitch width becomes too wide, and hence there is a limit in narrowing a pitch of the wiring portion on a wiring substrate as long as adhesive copper clad laminates in which a generally conventionally used copper foil having a thickness of 35 µm is bonded to an insulating film through an adhesive is utilized.

Therefore, a thin copper foil bonded substrate having a thickness not greater than 18 µm is used in place of the conventional copper foil bonded substrate having a thickness of 35 µm so that a width of a shape spreading toward the bottom obtained by side etching is reduced to narrow a pitch of the wiring portion on the wiring substrate.

However, since such a thin-walled copper foil has small rigidity and poor handling properties, there is adopted a method of temporarily bonding a reinforcing material such as an aluminum carrier to the copper foil to increase the rigidity, then bonding the copper foil to the insulating film, and further removing the aluminum carrier, but this method takes trouble and time and has a problem of poor operability and productivity.

Further, such a thin copper foil has a problem in a manufacturing technology, e.g., an increase in film defects due to unevenness in film thickness or occurrence of pin holes or cracks, the copper foil itself becomes difficult to be manufactured as a thickness of the copper foil is reduced, and a manufacturing price is increased, thereby losing cost merits of the adhesive flexible wiring substrate.

In particular, a demand for a wiring substrate having a wiring portion with a narrow width and a narrow pitch that cannot be manufactured unless a copper foil having a thickness of ten-odd µm or below or approximately several µm is used has been recently increased, and a wiring substrate using adhesive copper clad laminates has the above-explained technical problem as well as a manufacturing cost problem.

Thus, attention is paid to a double layer flexible wiring substrate using adhesiveless copper clad laminates in which a copper film layer can be directly formed on an insulating film without utilizing an adhesive in between.

According to such adhesiveless copper clad laminates, a copper conductor layer is directly formed on an insulating film without using an adhesive, a thickness of the board itself can be thereby reduced, and there is an advantage that a thickness of the copper conductor film to be applied can be adjusted to an arbitrary thickness.

Furthermore, when manufacturing such adhesiveless copper clad laminates, an electrolytic copper plating method is usually adopted as means for forming a copper conductor layer having a uniform thickness on an insulating film, but it is general to form a base metal layer on the insulating film to which the electrolytic copper plating film is applied to provide electroconductivity on the entire surface and then perform electrolytic copper plating processing (see, e.g., Patent Document 2).

Meanwhile, although it is known to use a dry plating method, e.g., a vacuum deposition method or an ion plating method, to obtain the base metal layer on the insulating film, many pin holes having a size of several-ten µm to several-hundred µm are produced in the film layer obtained by such a dry plating method, and hence an insulating film exposed portion due to the pin holes are often generated in the base metal layer.

In a conventional technology, generally, it is said that a range of 35 µm to 50 µm is appropriate as a thickness of a copper electroconductive film required for a wiring line in this type of flexible wiring substrate, but a width of the wiring line is also approximately several-hundred µm, a defect in the wiring portion due to presence of pin holes having a size of several-ten µm rarely occurs.

However, when obtaining a flexible wiring substrate having a wiring portion with a narrow width and a narrow pitch intended by the present invention, it is desirable to set a thickness of a copper film required to form a wiring portion to a very small thickness that is not greater than 18 µm or, preferably, not greater than 8 μm or, ideally, approximately 5 μm as described above, and a possibility of occurrence of a defect in the wiring portion is increased.

Explaining this situation while taking manufacture of a flexible wiring substrate by, e.g., a subtractive method using adhesiveless copper clad laminates in which a copper film layer having a desired thickness is formed on an insulating film having a base metal layer as an example, formation of a wiring portion pattern is carried out at the following steps.
(1) A resist layer having a desired wiring portion pattern by which a wiring portion alone is masked and a copper conductor layer of a non-wiring portion is exposed is provided on the copper conductor layer; (2) the exposed copper conductor layer is removed by chemical etching processing; and (3) the resist layer is peeled and removed at last.

Therefore, in case of using a substrate on which a copper film layer having a very small thickness, e.g., 5 μm is formed to manufacture a wiring substrate having a narrow wiring width, e.g., 15 μm and a narrow wiring pitch, e.g., 30 μm, a size of bulky ones of pin holes produced in a base metal layer of the substrate by the dry plating processing reaches an order of several-ten μm to several-hundred μm, and hence an insulating film exposed part due to the pin holes cannot be sufficiently filled when an electrolytic copper plating film having a thickness of approximately 5 μm is formed, whereby this exposed part, i.e., a defective part of the conductor layer reaches the wiring portion and the wiring portion gets chipped at positions of the pin holes to become a wiring defect, or even if not so, an adhesion failure of the wiring portion is led.

As a method of solving the above-described problem, a method of forming a base metal layer on an insulating film by a dry plating method and then applying a copper film layer as an intermediate metal layer obtained by electroless plating to coat an exposed part of the insulating film due to each pin hole has been proposed (see, e.g., Patent Document 3).

However, according to this method, an exposed part of the insulating film due to a pin hole can be assuredly eliminated to some extent but, on the other hand, it is known that a plating liquid, its preprocessing liquid, or the like used in electroless copper plating processing enters a space between the insulting film and the base metal layer from already formed large and small various pin hole parts, and this may possibly becomes a factor that obstructs adhesion properties of the base material layer and adhesion properties of a conductor layer subsequently formed by electrolytic copper plating, and hence this method is not a sufficient countermeasure.

Further, for example, Patent Document 4 proposes a non-adhesive flexible laminate including a polymer film having a plasma-processed surface, a nickel tie coating layer containing nickel or a nickel alloy that has adhered to the plasma-processed surface, a copper coating layer that has adhered to the nickel layer, and another copper layer that has adhered to the copper coating layer, and discloses the nickel tie coating layer whose metal for a nickel alloy is selected from a group including Cu, Cr, Fe, V, Ti, Al, Si, Pd, Ta, W, Zn, In, Sn, Mn, Co, and two or more mixtures of these metals. Specifically, as useful Ni alloys, there are Monel (approximately 67% Ni, and 30% Cu), Inconel (Approximately 76% Ni, 16% Cr, and 8% Fe) and others. This document explains that the obtained laminated film is superior in initial peel strength, peel strength after solder floating, and peel strength after a heat cycle, but does not describe about excellence in properties of a composite metal film.

Furthermore, for example, Patent Document 5 discloses that a first thin layer formed of at least one type of metal selected from a group including nickel, chrome, molybdenum, tungsten, vanadium, titanium, and manganese is formed on a polyimide side by a vacuum film forming method, a second thin layer with a predetermined thickness made of copper is formed thereon by the vacuum film forming method, and a third thin layer with a predetermined thickness made of copper is formed on the second thin layer by electroplating with a predetermined current density in order to improve heat-resisting adhesiveness of a polyamide/metal interface on a polyimide side of a copper-clad polyimide film provided by applying and hardening a polyimide varnish on a copper foil and improve productivity of this composite base material and durability and reliability of a final electrical product, but chrome alone is described as the first thin layer in an embodiment thereof, and excellence in properties of a composite metal film is not explained.

Likewise, for example, Patent Document 6 also discloses provision of a flexible printed wiring substrate by superimposing on one side or both sides of a plastic film a laminated body constituted of an evaporated layer of nickel, cobalt, chrome, palladium, titanium, zirconium, molybdenum, or tungsten and an electron beam heating evaporated copper layer that is superimposed on the evaporated layer, made of an aggregation of evaporated particles whose diameter falls in a range of 0.007 to 0.850 μm, and has a desired circuit formed thereon, and a mask layer that has no circuit formed thereon and is constituted of a mask layer made of an insulative organic material in order to provide a reliable inexpensive flexible printed wiring substrate superior in interlayer adhesion, heat resistance, chemical resistance, flexibility, and electrical characteristics, but a chrome evaporated layer alone is described in an embodiment of this document, and excellence in characteristics of a composite metal film is not explained at all.

Patent Document 1: Japanese Examined Patent Application Publication No. 1994-132628
Patent Document 2: Japanese Examined Patent Application Publication No. 1996-139448
Patent Document 3: Japanese Examined Patent Application Publication No. 1998-195668
Patent Document 4: PCT National Publication No. 2000-508265
Patent Document 5: Japanese Examined Patent Application Publication No. 1995-197239
Patent Document 6: Japanese Examined Patent Application Publication No. 1993-283848

DISCLOSURE OF INVENTION

Problems to be Solved by the Invention

It is an object of the present invention to solve the above-explained problems in manufacture of a flexible wiring substrate using a dry plating method and an electroplating method, and provide adhesiveless copper clad laminates which does not have defects on a copper film part due to a pin hole generated at the time of forming a base metal layer on an insulating film by a dry plating process, has excellent adhesion between the insulating film and the base metal layer and corrosion resistance, and has a copper film layer having high insulation reliability, and to provide a method for manufacturing such adhesiveless copper clad laminates.

Means for Solving the Problems

In adhesiveless copper clad laminates in which a base metal layer is directly formed on at least one plane of an insulating film without using an adhesive and a copper conductor layer with a desired thickness is formed on the base metal layer, the present inventors use adhesiveless copper clad laminates that have a base metal layer formed on the insulating film by a dry plating method and a copper film layer formed on the base metal layer, the base metal layer having a film thickness of 3 to 50 nm and mainly containing (1) a vanadium-molybdenum-nickel alloy in which a vanadium ratio is 4 to 13 weight %, a molybdenum ratio is 5 to 40 weight %, and the balance is nickel, or (2) a vanadium-chrome-molybdenum-nickel alloy in which a total ratio of vanadium and chrome is 4 to 13 weight % including at least 2 weight % of vanadium, a molybdenum ratio is 5 to 40 weight %, and the balance is nickel, and the present inventors can thereby obtain adhesiveless copper clad laminates that can solve the problems, have excellent adhesion and corrosion resistance, and have a copper conductor layer with high insulation reliability, and revealed that the adhesiveless copper clad laminates can be also applied to a flexible wiring substrate having a wiring portion with a narrow width and a narrow pitch, thus resulting in the present invention.

That is, a first aspect of the present invention provides adhesiveless copper clad laminates in which a base metal layer is directly formed on at least one plane of an insulating film without using an adhesive in between and a copper film layer is then formed on the base metal layer, wherein the base metal layer is constituted of a base metal layer having a film thickness of 3 to 50 nm that is formed by a dry plating method and mainly contains a vanadium-molybdenum-nickel alloy wherein a vanadium ratio is 4 to 13 weight %, a molybdenum ratio is 5 to 40 weight %, and the balance is nickel.

Further, a second aspect of the present invention provides adhesiveless copper clad laminates in which a base metal layer is directly formed on at least one plane of an insulating film without using an adhesive in between and a copper film layer is then formed on the base metal layer, wherein the base metal layer is constituted of a base metal layer having a film thickness of 3 to 50 nm that is formed by a dry plating method and mainly contains a vanadium-chrome-molybdenum-nickel alloy wherein a total ratio of vanadium and chrome is 4 to 13 weight % including at least 2 weight % of vanadium, a molybdenum ratio is 5 to 40 weight %, and the balance is nickel.

Further, a third aspect of the present invention provides the adhesiveless copper clad laminates defined in the first or the second invention, wherein the copper film layer formed on the base metal layer has a film thickness of 10 nm to 35 μm.

Furthermore, a fourth aspect of the present invention provides the adhesiveless copper clad laminates defined in the first to the third inventions, wherein the insulating film is a resin film selected from a polyimide-based film, a polyamide-based film, a polyester-based film, a polytetrafluoroethylene-based film, a polyphenylene sulfide-based film, a polyethylene naphthalate-based film, and a liquid crystal polymer-based film.

A fifth aspect of the present invention provides a method for manufacturing adhesiveless copper clad laminates in which a base metal layer is directly formed on at least one plane of an insulating film without using an adhesive in between and a copper film layer is then formed on the base metal layer, the method comprising: forming the base metal layer having a film thickness of 3 to 50 nm on the insulating film by a dry plating method, the base metal layer mainly containing a vanadium-molybdenum-nickel alloy wherein a vanadium ratio is 4 to 13 weight %, a molybdenum ratio is 5 to 40 weight %, and the balance is nickel; and forming the copper film layer on the base metal layer. Further, a sixth aspect of the present invention provides a method for manufacturing adhesiveless copper clad laminates in which a base metal layer is directly formed on at least one plane of an insulating film without using an adhesive in between and a copper film layer is then formed on the base metal layer, the method comprising: forming the base metal layer having a film thickness of 3 to 50 nm on the insulating film by a dry plating method, the base metal layer mainly containing a vanadium-chrome-molybdenum-nickel alloy wherein a total ratio of vanadium and chrome is 4 to 13 weight % including at least 2 weight % of vanadium, a molybdenum ratio is 5 to 40 weight %, and the balance is nickel; and forming the copper film layer on the base metal layer.

Additionally, a seventh aspect of the present invention provides the method for manufacturing adhesiveless copper clad laminates defined in the fifth or the sixth aspects of the present invention, wherein the copper film layer is formed by the dry plating method, and then a copper film layer is further formed on the copper film layer by a wet plating method.

Further, an eighth aspect of the present invention according to the present invention provides the method for manufacturing adhesiveless copper clad laminates defined in the fifth to the seventh aspects of the present invention, wherein the dry plating method is one of a vacuum deposition method, a sputtering method, and an ion plating method.

Effect of the Invention

According to the method for manufacturing adhesiveless copper clad laminates of the present invention, in adhesiveless copper clad laminates provided by forming a base metal layer directly at least on one plane of an insulating film without having an adhesive in between and then by forming a copper film layer on the base metal, it is possible to obtain the adhesiveless copper clad laminates characterized by having the base metal layer with a film thickness of 3 to 50 nm formed on the insulating film by a dry plating method and the copper film layer with formed on the base metal layer, the base metal layer mainly containing (1) a vanadium-molybdenum-nickel alloy in which a vanadium ratio is 4 to 13 weight %, a molybdenum ratio is 5 to 40 weight %, and the balance is nickel, or (2) a vanadium-chrome-molybdenum-nickel alloy in which a total ratio of vanadium and chrome is 4 to 13 weight % including at least 2 weight % of vanadium, a molybdenum ratio is 5 to 40 weight %, and the balance is nickel.

Furthermore, according to the adhesiveless copper clad laminates of the present invention, a reduction in heat-resisting peel strength can be avoided since the base metal layer contains vanadium or both vanadium and chrome, corrosion resistance and insulation reliability can be improved since the base metal layer contains molybdenum, and hence using the adhesiveless copper clad laminates can efficiently obtain a flexible wiring substrate that has excellent adhesion and corrosion resistance and has a defect-free reliable wiring portion with a narrow width and a narrow pitch, whereby an effect of the adhesiveless copper clad laminates is extremely large.

BEST MODES FOR CARRYING OUT THE INVENTION

1) Adhesiveless Copper Clad Laminates

Adhesiveless copper clad laminates according to the present invention is adhesiveless copper clad laminates provided by forming a base metal layer directly at least on one plane of an insulating film without having an adhesive in between and forming a copper conductor layer with a desired thickness on the base metal layer, and is characterized in that the base metal layer having a film thickness of 3 to 50 nm is formed on the insulating film by a dry plating method and a copper film layer is formed on the base metal layer, the base metal layer mainly containing (1) a vanadium-molybdenum-nickel alloy in which a vanadium ratio is 4 to 13 weight %, a molybdenum ratio is 5 to 40 weight %, and the balance is nickel, or (2) a vanadium-chrome-molybdenum-nickel alloy in which a total ratio of vanadium and chrome is 4 to 13 weight % including at least 2 weight % of vanadium, a molybdenum ratio is 5 to 40 weight %, and the balance is nickel.

Adopting the above-described structure can obtain the adhesiveless copper clad laminates that has excellent adhesion and corrosion resistance and has a copper conductor layer with high insulation reliability formed thereon.

Here, as a film thickness of the base metal layer mainly containing the vanadium-molybdenum-nickel alloy or the vanadium-chrome-molybdenum-nickel alloy obtained by the dry plating method, a range of 3 to 50 nm is preferable. When the film thickness is smaller than 3 nm, a problem of, e.g., a considerable reduction in wiring peel strength occurs because an etchant used when performing wiring processing infiltrates to thereby raise a wiring portion, and hence this film thickness is not preferable. Additionally, when the film thickness exceeds 50 nm, effecting etching is difficult, and hence this film thickness is not preferable. Further, as a composition of the base metal layer, the vanadium ratio must be 4 to 13 weight %, the molybdenum ratio must be 5 to 40 weight %, and the balance must be nickel, or a total ratio of vanadium and chrome must be 4 to 13 weight % including at least 2 weight % of vanadium, the molybdenum ratio must be 5 to 40 weight %, and the balance must be nickel.

First, the vanadium ratio must be 4 to 13 weight % in order to prevent heat-resisting peel strength from being considerably lowered due to heat deterioration. When the vanadium ratio becomes lower than 4 weight %, a considerable reduction in heat-resisting peel strength due to heat deterioration cannot be avoided, and hence this is not preferable. Furthermore, when the vanadium ratio exceeds 13 weight %, performing etching is difficult which is not preferable, and simultaneous sputtering must be performed because of processability of a target, thereby leading to a reduction in productivity.

Moreover, likewise, the total ratio of vanadium and chrome must be 4 to 13 weight % including at least 2 weight % of vanadium in order to prevent heat-resisting peel strength from being considerably lowered due to heat deterioration. When the vanadium ratio becomes lower than 2 weight % or the total ratio of vanadium and chrome becomes lower than 4 weight %, a considerable reduction in heat-resisting peel strength due to heat deterioration cannot be avoided, and hence this is not preferable. Furthermore, when the total ratio of vanadium and chrome exceeds 13 weight %, performing etching is difficult which is not preferable, and simultaneous sputtering must be performed because of processability of a target, thereby leading to a reduction in productivity. Moreover, the molybdenum ratio must be 5 to 40 weight % in order to improve corrosion resistance and insulation reliability. When the molybdenum ratio is less than 5 weight %, an addition effect is not demonstrated, and corrosion resistance and insulation reliability cannot be improved, which is not preferable. Additionally, when the molybdenum ratio exceeds 40 weight %, heat-resisting peel strength tends to be extremely decreased, which is not preferable.

Further, in case of a regular nickel base alloy target, if a nickel ratio exceeds 93%, a sputtering target itself serves as a ferromagnetic substance, and a film formation rate is lowered when the film is formed by magnetron sputtering, which is not preferable. In a target composition according to this structure, since a nickel amount is equal to or smaller than 93%, an excellent film formation rate can be obtained even if the film is formed by using the magnetron sputtering method.

Meanwhile, a transition metal element can be appropriately added to the vanadium-molybdenum-nickel alloy or the vanadium-chrome-molybdenum-nickel alloy in accordance with intended characteristics in order to improve heat resistance or corrosion resistance.

Furthermore, besides the vanadium-molybdenum-nickel alloy or the vanadium-chrome-molybdenum-nickel alloy, an unavoidable impurity which is contained by, e.g., import during manufacture of a target and whose ratio is not greater than one weight % may be present in the base metal layer.

Therefore, in Table 1, a nickel amount including the unavoidable impurity whose ratio is not greater than one weight % is represented as a balance (=bal.).

In the adhesiveless copper clad laminates according to the present invention, it is preferable that a film thickness of the copper film layer including both the copper film layer formed on the base metal layer by the dry plating method and the copper film layer superimposed and formed on the copper film layer by the wet plating method is 10 nm to 35 μm. When this film thickness is smaller than 10 nm, the copper film layer formed by the wet plating method becomes thin, and hence power feeding becomes difficult in a subsequent wet plating process, which is not preferable. Further, when this film thickness exceeds 35 μm, productivity is lowered, which is not preferable.

In the adhesiveless copper clad laminates according to the present invention, although there is a resin film selected from a polyimide-based film, a polyamide-based film, a polyester-based film, a polytetrafluoroethylene-based film, a polyphenylene sulfide-based film, a polyethylene naphthalate-based film, and a liquid crystal polymer-based film as the insulating film, the polyimide-based film and the polyamide-based film are preferable in that they are suitable for an application requiring high-temperature connection, e.g., solder reflow.

Furthermore, as the film, one having a film thickness of 8 to 75 μm can be preferably used. It is to be noted that an inorganic material, e.g., glass fiber can be appropriately added.

Moreover, as the dry plating method, it is possible to use one of a vacuum deposition method, a sputtering method, and an ion plating method.

On the other hand, forming the copper layer by the dry plating method and then superimposing and forming the copper film layer on the copper film layer by the wet plating method is suitable for forming a relatively thick film.

2) Method for Manufacturing Adhesiveless Copper Clad Laminates

A method for manufacturing adhesiveless copper clad laminates according to the present invention will now be described in detail.

In the present invention, as explained above, the base metal layer is directly formed on at least one plane of the insulating film as a resin film selected from a polyimide-based film, a polyamide-based film, a polyester-based film, a polytetrafluoroethylene-based film, a polyphenylene sulfide-based film, a polyethylene naphthalate-based film, and a liquid crystal polymer-based film without using an adhesive in between, and the copper conductor layer having a desired thickness is formed on the base metal layer.

a) Dehydration Processing

The film usually contains moisture, and atmospheric drying and/or vacuum drying must be carried out to remove the moisture present in the film before forming the base metal layer mainly containing the vanadium-molybdenum-nickel alloy or the vanadium-chrome-molybdenum-nickel alloy by the dry plating method. If this removal is insufficient, adhesion with respect to the base metal layer is deteriorated.

b) Formation of Base Metal Layer

When forming the base metal layer mainly containing the vanadium-molybdenum-nickel alloy or the vanadium-chrome-molybdenum-nickel alloy by the dry plating method, e.g., when using a take-up sputtering device to form the base metal layer, an alloy target having a composition of the base metal layer is attached to a sputtering cathode. Rolling processability is considerably lowered when an amount of vanadium exceeds 13 weight % in case of a vanadium-molybdenum-nickel alloy target, or when a total ratio of vanadium and chrome exceeds 13 weight % in case of a vanadium-chrome-molybdenum-nickel alloy target, and hence manufacture is difficult. When the amount of vanadium or the total ratio of vanadium and chrome exceeds the above-described value, a nickel-vanadium alloy target or a vanadium-chrome-nickel alloy target and a molybdenum target can be attached to two cathodes to be simultaneously sputtered, and an input power of each cathode can be controlled to obtain the base metal layer having a desired film composition, but this is not preferable because of characteristics and the composition in the present invention.

Specifically, after the sputtering device having the film set therein is evacuated to form a vacuum therein, an Ar gas is introduced, the inside of the device is maintained at approximately 1.3 Pa, and an electric power is supplied from a sputtering direct-current power supply connected with the cathode to start sputtering discharge while carrying the insulating film disposed to a reeling/unreeling roll in the device at a speed of approximately 3 m/minute, thereby continuously forming the metal layer mainly containing the vanadium-molybdenum-nickel alloy or the vanadium-chrome-molybdenum-nickel alloy on the film. This film formation allows the base metal film with a desired film thickness mainly containing the vanadium-molybdenum-nickel alloy or the vanadium-chrome-molybdenum-nickel alloy to be formed on the film.

c) Formation of Copper Film Layer

Likewise, the sputtering device in which a copper target is attached to the sputtering cathode can be used to form the copper film layer by the dry plating method. At this time, it is preferable to continuously form the base metal layer and the copper film layer in the same vacuum chamber.

Moreover, when further forming the copper film layer on the copper film layer by the wet plating method, there are two cases, i.e., forming this film by electrolytic copper plating processing alone and forming this film by a combination of electroless copper plating processing as primary plating and a wet plating method, e.g., electrolytic copper plating processing as secondary plating.

Here, the electroless copper plating processing is carried out as the primary plating because a rough and large pin hole may be formed and an exposed part may be thereby formed on a surface of the insulating film when dry plating is performed based on vapor deposition, and hence an electroless-copper-plated film layer is formed on the entire substrate surface to cover the film exposed surface in order to form an excellent conductor on the entire substrate surface to avoid an influence of the pin hole.

It is to be noted that any reducing deposition type liquid in which a metal ion contained therein has autocatalytic properties and is reduced by a reducer, e.g., hydrazine, phosphinic acid sodium, or formalin to be subjected metal deposition may be used as an electroless plating liquid used in electroless plating, but the present invention has a purpose of realizing an excellent conductor at the exposed part of the insulating film caused due to a pin hole generated in the base metal layer, and hence an electroless copper plating liquid having excellent electroconductivity and relatively good workability is optimum.

Additionally, as a thickness of the copper-plated film layer provided by the electroless copper plating processing as the primary plating, a thickness that allows a defect due to a pin hole on the substrate surface to be remedied and prevents dissolution by the electrolytic copper plating liquid when performing the electrolytic copper plating processing as the later-described secondary plating can suffice, and it is preferable for this thickness to fall within a range of 0.01 to 1.0 µm.

The electrolytic copper plating processing as the secondary plating is performed on the electroless-copper-plated film layer in order to form the copper conductor layer with a desired thickness.

According to the copper film layer formed on the base metal layer in this manner, it is possible to obtain the adhesiveless copper clad laminates that is not affected by large and small various pin holes generated in formation of the base metal layer and has excellent adhesion of the conductor layer.

It is to be noted that various conditions in the wet copper plating method can be adopted for both the primary and the secondary plating in the wet copper plating processing carried out in the present invention.

Further, a total thickness of the copper film layers formed on the base metal layer by the wet/dry plating methods in this manner must be set to equal to or below 35 µm at maximum.

3) Formation of Wiring Pattern

The above-described adhesiveless copper clad laminates according to the present invention is used to individually form a wiring pattern on at least one plane of the adhesiveless copper clad laminates. Furthermore, a via hole for interlayer connection can be formed at a predetermined position to be used in various applications.

More specifically, (a) a high-density wiring pattern is individually formed on at least one plane of a flexible sheet. (b) A via hole piercing the wiring layer and the flexible sheet is formed in the flexible sheet having the wiring layer formed thereon. (c) An electroconductive material is filled in the via hole to provide electroconductivity in the hole in some cases.

As a method for forming the wiring pattern, it is possible to use a conventionally known method, e.g., photo-etching by which adhesiveless copper clad laminates having a copper film layer formed on at least one plane thereof is prepared, screen printing or a dry film is laminated on the copper to form a photosensitive resist film, and then exposure development is carried out to perform patterning, for example. Subsequently, the metal foil is selectively etched by using an etchant, e.g., a ferric chloride solution, and then the resist is removed to form a predetermined wiring pattern.

In order to realize density growth of wiring lines, it is preferable to prepare adhesiveless copper clad laminates having copper film layers formed on both planes thereof and pattern both the planes to form wiring patterns on both the planes of the substrate. Although how all the wiring patterns are divided into some wiring regions is dependent on, e.g., a distribution of a wiring density of the wiring patterns, it is good enough to divide the wiring patterns into a high-density wiring region having both a wiring width and a wiring gap that are not greater than 50 µm and any other wiring region, and set a size of the wiring substrate to be divided to approximately 10 to 65 mm while considering a thermal expansion difference from a printed substrate, convenience in handling and others, thereby performing appropriate division.

As a method for forming the via hole, a conventionally known method can be used, and the via hole piercing the wiring pattern and the flexible sheet is formed at a predetermined position on the wiring pattern by, e.g., laser processing or photo-etching. It is preferable to reduce a diameter of the via hole so that provision of electroconductivity in the hole is not obstructed, and the diameter is usually set to 100 μm or below or, preferably 50 μm or below.

An electroconductive metal, e.g., copper is filled in the via hole by plating, vapor deposition, or sputtering, or a mask having a predetermined opening pattern is used to press fit an electroconductive paste in the via hole, and the electroconductive metal or paste is dried to provide electroconductivity in the hole, thus electrically connecting the layers with each other. As the electroconductive metal, there is copper, gold, nickel, or the like.

EXAMPLES

Examples according to the present invention will now be explained together with comparative examples.

As a method for measuring peel strength, a method conforming to IPC-TM-650, NUMBER 2.4.9 was used. However, a lead width was determined as 1 mm, and an angle of peeling was determined as 90°. A lead was formed by a subtractive method or a semi-additive method. Further, as an index of heat resistance, a film base material having a lead of 1 mm formed thereon was left in an oven at 150° C. for 168 hours, taken out from the oven, and left until a room temperature is reached, and peel strength at 90° was evaluated.

First, the obtained adhesiveless copper clad laminates was used, and a comb-tooth test piece having a pitch of 30 (a line/a space=15/15 μm) was formed by ferric chloride etching based on the subtracting method, or a test piece formed by the semi-additive method was manufactured.

Etching properties were basically confirmed by using a microscope to observe the test piece. Furthermore, an insulating resistance value of a test piece of HHBT was also measured and, and it was determined that an etching residue is present between the leads and etching properties are poor in case of a resistance value that is not greater than $10^{-6}\Omega$.

In measurement of an HHBT (High Temperature High Humidity Bias Test) as an environment resistance test, the test piece is used, and DC 40 V is applied between terminals in an RH environment of 85° C. and 85% based on JPCA-ET04 to observe a 1000 hr resistance. A short-circuit defect was determined when the resistance was reduced to $10^6\Omega$ or below, and a success in the test was determined when the resistance was not lower than $10^6\Omega$ even after elapse of 1000 hours.

As an index of corrosion, there is discoloration on a rear surface, and this was performed by observing a rear surface of a sample after the HHBT. A defect was determined when considerable discoloration was observed, and a success was determined when discoloration is minor.

Example 1

A polyimide film (a product name: "Kapton 150EN" manufactured by Du Pont-Toray Co., Ltd.) having a thickness of 38 μm was cut out with a size of 12 cm×12 cm, a V—Mo—Ni alloy target in which a V ratio is 4 weight % and an Mo ratio is 20 weight % (manufactured by Sumitomo Metal Mining Co., Ltd) was used as a first layer of a base metal layer on one plane of the polyimide film to form a V—Mo—Ni alloy base metal layer in which a V ratio is 4 weight % and an Mo ratio is 20 weight % by a direct-current sputtering method.

When a film thickness of a part of the film formed under the same conditions was separately measured by using a transmission electron microscope (TEM: manufactured by Hitachi Ltd.), it was 20 nm. A copper film layer with a thickness of 200 nm was further formed as a second layer on the V—Mo—Ni film based on the sputtering method using a Cu target (manufactured by Sumitomo Metal Mining Co., Ltd), and electroplating was used to form the film up to 8 μm, thereby obtaining a raw base material for evaluation. A lead of 1 mm for peel strength evaluation and a comb-tooth test piece having a 30 μm pitch for the HHBT were formed from this base material by the subtracting method.

Initial peel strength of the obtained adhesive copper clad laminates was 641 N/m. Heat-resisting peel strength after being left in the oven at 150° C. for 168 hours was 533 N/m without a considerable change, and hence it was excellent.

An insulation reliability test was conducted with respect to three samples, and no deterioration was observed in all the samples. Further, all the samples had no etching residue and excellent etching properties. Furthermore, no change was observed in a corrosion resistance test (discoloration on a rear surface of the film after being left in an RH constant-temperature tank at 85° C. and 85% for 1000 hours).

Example 2

A raw base metal for evaluation was obtained like Example 1 except that a V—Mo—Ni alloy target in which a V ratio is 13 weight % and an Mo ratio is 20 weight % (manufactured by Sumitomo Metal Mining Co., Ltd.) was used as a first layer of a base metal layer to form a film of a V—Mo—Ni alloy base metal layer in which a V ratio is 13 weight % and an Mo ratio is 20 weight % by the direct-current sputtering method.

When a film thickness of a part of the film formed under the same conditions was separately measured by a transmission electron microscope (TEM: manufactured by Hitachi Ltd.), it was 20 nm. A lead of 1 mm for the peel strength evaluation and a comb-tooth test piece having a 30 μm pitch for the HHBT were formed from this base material by the subtracting method.

Initial peel strength of the obtained adhesive copper clad laminates was 625 N/m. Heat-resisting peel strength after being left in the oven at 150° C. for 168 hours was 515 N/m without a considerable change, and hence it was excellent.

The insulation reliability test was conducted with respect to three samples, but no deterioration was observed in all the samples. Moreover, all the samples had no etching residue and excellent etching properties. Additionally, no change was observed in the corrosion resistance test (discoloration on a rear surface of the film after being left in an RH constant-temperature tank at 85° C. and 85% for 1000 hours).

Example 3

A raw base metal for evaluation was obtained like Example 1 except that a V—Mo—Ni alloy target in which a V ratio is 7 weight % and an Mo ratio is 5 weight % (manufactured by Sumitomo Metal Mining Co., Ltd.) was used as a first layer of a base metal layer to form a film of a V—Mo—Ni alloy base metal layer in which a V ratio is 7 weight % and an Mo ratio is 5 weight % by the direct-current sputtering method.

When a film thickness of a part of the film formed under the same conditions was separately measured by a transmission electron microscope (TEM: manufactured by Hitachi Ltd.), it was 20 nm. A lead of 1 mm for the peel strength evaluation and a comb-tooth test piece having a 30 μm pitch for the HHBT were formed from this base material by the subtracting method.

Initial peel strength of the obtained adhesive copper clad laminates was 670 N/m. Heat-resisting peel strength after being left in the oven at 150° C. for 168 hours was 513 N/m without a considerable change, and hence it was excellent.

The insulation reliability test was conducted with respect to three samples, but no deterioration was observed in all the samples. Moreover, all the samples had no etching residue and excellent etching properties. Additionally, no change was observed in the corrosion resistance test (discoloration on a rear surface of the film after being left in an RH constant-temperature tank at 85° C. and 85% for 1000 hours).

Example 4

A raw base metal for evaluation was obtained like Example 1 except that a V—Mo—Ni alloy target in which a V ratio is 7 weight % and an Mo ratio is 40 weight % (manufactured by Sumitomo Metal Mining Co., Ltd.) was used as a first layer of a base metal layer to form a film of a V—Mo—Ni alloy base metal layer in which a V ratio is 7 weight % and an Mo ratio is 40 weight % by the direct-current sputtering method.

When a film thickness of a part of the film formed under the same conditions was separately measured by a transmission electron microscope (TEM: manufactured by Hitachi Ltd.), it was 20 nm. A lead of 1 mm for the peel strength evaluation and a comb-tooth test piece having a 30 μm pitch for the HHBT were formed from this base material by the subtracting method.

Initial peel strength of the obtained adhesive copper clad laminates was 690 N/m. Heat-resisting peel strength after being left in the oven at 150° C. for 168 hours was 503 N/m without a considerable change, and hence it was excellent.

The insulation reliability test was conducted with respect to three samples, but no deterioration was observed in all the samples. Moreover, all the samples had no etching residue and excellent etching properties. Additionally, no change was observed in the corrosion resistance test (discoloration on a rear surface of the film after being left in an RH constant-temperature tank at 85° C. and 85% for 1000 hours).

Example 5

A raw base metal for evaluation was obtained like Example 1 except that a V—Mo—Ni alloy target in which a V ratio is 7 weight % and an Mo ratio is 20 weight % (manufactured by Sumitomo Metal Mining Co., Ltd.) was used as a first layer of a base metal layer to form a film of a V—Mo—Ni alloy base metal layer in which a V ratio is 7 weight % and an Mo ratio is 20 weight % by the direct-current sputtering method, and a sputtering time was shortened to vary a film thickness.

When a film thickness of a part of the film formed under the same conditions was separately measured by a transmission electron microscope (TEM: manufactured by Hitachi Ltd.), it was 3 nm. A lead of 1 mm for the peel strength evaluation and a comb-tooth test piece having a 30 μm pitch for the HHBT were formed from this base material by the subtracting method.

Initial peel strength of the obtained adhesive copper clad laminates was 601 N/m. Heat-resisting peel strength after being left in the oven at 150° C. for 168 hours was 533 N/m without a considerable change, and hence it was excellent.

The insulation reliability test was conducted with respect to three samples, but no deterioration was observed in all the samples. Moreover, all the samples had no etching residue and excellent etching properties. Additionally, no change was observed in the corrosion resistance test (discoloration on a rear surface of the film after being left in an RH constant-temperature tank at 85° C. and 85% for 1000 hours).

Example 6

A raw base metal for evaluation was obtained like Example 1 except that a V—Mo—Ni alloy target in which a V ratio is 7 weight % and an Mo ratio is 20 weight % (manufactured by Sumitomo Metal Mining Co., Ltd.) was used as a first layer of a base metal layer to form a film of a V—Mo—Ni alloy base metal layer in which a V ratio is 7 weight % and an Mo ratio is 20 weight % by the direct-current sputtering method, and a sputtering time was prolonged to vary a film thickness.

When a film thickness of a part of the film formed under the same conditions was separately measured by a transmission electron microscope (TEM: manufactured by Hitachi Ltd.), it was 50 nm. A lead of 1 mm for the peel strength evaluation and a comb-tooth test piece having a 30 μm pitch for the HHBT were formed from this base material by the subtracting method.

Initial peel strength of the obtained adhesive copper clad laminates was 608 N/m. Heat-resisting peel strength after being left in the oven at 150° C. for 168 hours was 575 N/m without a considerable change, and hence it was excellent.

The insulation reliability test was conducted with respect to three samples, but no deterioration was observed in all the samples. Moreover, all the samples had no etching residue and excellent etching properties. Additionally, no change was observed in the corrosion resistance test (discoloration on a rear surface of the film after being left in an RH constant-temperature tank at 85° C. and 85% for 1000 hours).

Example 7

A V—Mo—Ni film having a film thickness of 20 nm was formed like Example 1. Further, a Cu target (manufactured by Sumitomo Metal Mining Co., Ltd.) was used to form a copper film layer with a thickness of 1 μm as a second layer on the V—Mo—Ni film by a sputtering method, and the film formation was carried out up to 8 μm by electroplating to obtain a raw base material for evaluation. A lead of 1 mm for the peel strength evaluation and a comb-tooth test piece having a 30 μm pitch for the HHBT were formed from this base material by the subtracting method.

Initial peel strength of the obtained adhesive copper clad laminates was 615 N/m. Heat-resisting peel strength after being left in the oven at 150° C. for 168 hours was 575 N/m without a considerable change, and hence it was excellent.

The insulation reliability test was conducted with respect to three samples, but no deterioration was observed in all the samples. Moreover, all the samples had no etching residue and excellent etching properties. Additionally, no change was observed in the corrosion resistance test (discoloration on a rear surface of the film after being left in an RH constant-temperature tank at 85° C. and 85% for 1000 hours).

Example 8

A V—Mo—Ni film having a film thickness of 20 nm was formed like Example 1. Further, a Cu target (manufactured by Sumitomo Metal Mining Co., Ltd.) was used to form a copper film layer as a second layer on the V—Mo—Ni film up to 8 μm by the sputtering method, thereby obtaining a raw base material for evaluation. A lead of 1 mm for the peel strength evaluation and a comb-tooth test piece having a 30 μm pitch for the HHBT were formed from this base material by the subtracting method.

Initial peel strength of the obtained adhesive copper clad laminates was 628 N/m. Heat-resisting peel strength after being left in the oven at 150° C. for 168 hours was 540 N/m without a considerable change, and hence it was excellent.

The insulation reliability test was conducted with respect to three samples, but no deterioration was observed in all the samples. Moreover, all the samples had no etching residue and excellent etching properties. Additionally, no change was observed in the corrosion resistance test (discoloration on a rear surface of the film after being left in an RH constant-temperature tank at 85° C. and 85% for 1000 hours).

Example 9

A V—Mo—Ni film having a film thickness of 20 nm was formed like Example 1. Further, a Cu target (manufactured by Sumitomo Metal Mining Co., Ltd.) was used to form a copper film layer as a second layer on the V—Mo—Ni film up to 500 nm by the sputtering method, and thickening was carried out up to 8 μm by a semi-additive method to form a lead of 1 mm for the peel strength evaluation and a comb-tooth test piece having a 30 μm pitch for the HHBT from this base material.

Initial peel strength of the obtained adhesive copper clad laminates was 630 N/m. Heat-resisting peel strength after being left in the oven at 150° C. for 168 hours was 518 N/m without a considerable change, and hence it was excellent.

The insulation reliability test was conducted with respect to three samples, but no deterioration was observed in all the samples. Moreover, all the samples had no etching residue and excellent etching properties. Additionally, no change was observed in the corrosion resistance test (discoloration on a rear surface of the film after being left in an RH constant-temperature tank at 85° C. and 85% for 1000 hours).

Example 10

A raw base metal for evaluation was obtained like Example 1 except that a V—Cr—Mo—Ni alloy target in which a V ratio is 2 weight %, a Cr ratio is 2 weight %, and an Mo ratio is 20 weight % (manufactured by Sumitomo Metal Mining Co., Ltd.) was used as a first layer of a base metal layer to form a film of a V—Cr—Mo—Ni alloy base metal layer in which a V ratio is 2 weight %, a Cr ratio is 2 weight %, and an Mo ratio is 20 weight % by the direct-current sputtering method.

When a film thickness of a part of the film formed under the same conditions was separately measured by a transmission electron microscope (TEM: manufactured by Hitachi Ltd.), it was 20 nm. A lead of 1 mm for the peel strength evaluation and a comb-tooth test piece having a 30 μm pitch for the HHBT were formed from this base material by the subtracting method.

Initial peel strength of the obtained adhesive copper clad laminates was 652 N/m. Heat-resisting peel strength after being left in the oven at 150° C. for 168 hours was 541 N/m without a considerable change, and hence it was excellent.

The insulation reliability test was conducted with respect to three samples, but no deterioration was observed in all the samples. Moreover, all the samples had no etching residue and excellent etching properties. Additionally, no change was observed in the corrosion resistance test (discoloration on a rear surface of the film after being left in an RH constant-temperature tank at 85° C. and 85% for 1000 hours).

Example 11

A raw base material for evaluation was obtained like Example 1 except that an aromatic polyamide film (a product name: "Aramica 120RC" manufactured by Teijin Advanced Films Limited) having a thickness of 12 μm was used as a film.

When a film thickness of a part of the film formed under the same conditions was separately measured, it was 20 nm. A lead of 1 mm for the peel strength evaluation and a comb-tooth test piece having a 30 μm pitch for the HHBT were formed from this base material by the subtracting method.

Initial peel strength of the obtained adhesive copper clad laminates was 602 N/m. Heat-resisting peel strength after being left in the oven at 150° C. for 168 hours was 501 N/m without a considerable change, and hence it was excellent.

The insulation reliability test was conducted with respect to three samples, but no deterioration was observed in all the samples. Moreover, all the samples had no etching residue and excellent etching properties. Additionally, no change was observed in the corrosion resistance test (discoloration on a rear surface of the film after being left in an RH constant-temperature tank at 85° C. and 85% for 1000 hours).

Comparative Example 1

A raw base metal for evaluation was obtained like Example 1 except that a V—Mo—Ni alloy target in which a V ratio is 3 weight % and an Mo ratio is 20 weight % (manufactured by Sumitomo Metal Mining Co., Ltd.) was used as a first layer of a base metal layer to form a film of a V—Mo—Ni alloy base metal layer in which a V ratio is 3 weight % and an Mo ratio is 20 weight % by the direct-current sputtering method.

When a film thickness of a part of the film formed under the same conditions was separately measured by a transmission electron microscope (TEM: manufactured by Hitachi Ltd.), it was 20 nm. A lead of 1 mm for the peel strength evaluation and a comb-tooth test piece having a 30 pitch for the HHBT were formed from this base material by the subtracting method.

Initial peel strength of the obtained adhesive copper clad laminates was 656 N/m. Heat-resisting peel strength after being left in the oven at 150° C. for 168 hours was 364 N/m, and hence a considerable reduction was observed.

The insulation reliability test was conducted with respect to three samples, and deterioration in insulation properties was observed in the two samples.

On the other hand, etching properties were excellent.

Additionally, no change was observed on a film rear surface in the corrosion resistance test (discoloration on a rear surface of the film after being left in an RH constant-temperature tank at 85° C. and 85% for 1000 hours).

Comparative Example 2

A raw base metal for evaluation was obtained like Example 1 except that a V—Mo—Ni alloy target in which a V ratio is 7 weight % and an Mo ratio is 0.5 weight % (manufactured by Sumitomo Metal Mining Co., Ltd.) was used as a first layer of a base metal layer to form a film of a V—Mo—Ni alloy base metal layer in which a'V ratio is 7 weight % and an Mo ratio is 0.5 weight % by the direct-current sputtering method.

When a film thickness of a part of the film formed under the same conditions was separately measured by a transmission electron microscope (TEM: manufactured by Hitachi Ltd.), it was 20 nm. A lead of 1 mm for the peel strength evaluation and a comb-tooth test piece having a 30 μm pitch for the HHBT were formed from this base material by the subtracting method.

Initial peel strength of the obtained adhesive copper clad laminates was 620 N/m. Heat-resisting peel strength after being left in the oven at 150° C. for 168 hours was 524 N/m without a considerable change, and hence it was excellent.

Further, the insulation reliability test was to be conducted with respect to three samples, but a resistance was reduced to $10^6 \Omega$ or below to result in a short-circuit failure in the two samples. On the other hand, all the samples had excellent etching properties.

Additionally, discoloration was observed at many positions on a rear surface of the film in the corrosion resistance test (discoloration on the rear surface of the film after being left in an RH constant-temperature tank at 85° C. and 85% for 1000 hours).

Comparative Example 3

A raw base metal for evaluation was obtained like Example 1 except that a V—Mo—Ni alloy target in which a V ratio is 7 weight % and an Mo ratio is 44 weight % (manufactured by Sumitomo Metal Mining Co., Ltd.) was used as a first layer of a base metal layer to form a film of a V—Mo—Ni alloy base metal layer in which a V ratio is 7 weight % and an Mo ratio is 44 weight % by the direct-current sputtering method.

When a film thickness of a part of the film formed under the same conditions was separately measured by a transmission electron microscope (TEM: manufactured by Hitachi Ltd.), it was 20 nm. A lead of 1 mm for the peel strength evaluation and a comb-tooth test piece having a 30 μm pitch for the HHBT were formed from this base material by the subtracting method.

Initial peel strength of the obtained adhesive copper clad laminates was 634 N/m. Heat-resisting peel strength after being left in the oven at 150° C. for 168 hours was greatly reduced to be 284 N/m.

The insulation reliability test was conducted with respect to three samples, but no deterioration was observed in all the samples.

Moreover, all the samples had excellent etching properties.

Additionally, no change was observed in the corrosion resistance test (discoloration on a rear surface of the film after being left in an RH constant-temperature tank at 85° C. and 85% for 1000 hours).

Comparative Example 4

A raw base metal for evaluation was obtained like Example 1 except that a V—Mo—Ni alloy target in which a V ratio is 7 weight % and an Mo ratio is 20 weight % (manufactured by Sumitomo Metal Mining Co., Ltd.) was used as a first layer of a base metal layer to form a film of a V—Mo—Ni alloy base metal layer in which a V ratio is 7 weight % and an Mo ratio is 20 weight % by the direct-current sputtering method, and a sputtering time was changed to a shorter time than that in Example 5 to vary a film thickness.

When a film thickness of a part of the film formed under the same conditions was separately measured by a transmission electron microscope (TEM: manufactured by Hitachi Ltd.), it was 2 nm. A lead of 1 mm for the peel strength evaluation and a comb-tooth test piece having a 30 μm pitch for the HHBT were formed from this base material by the subtracting method.

Initial peel strength of the obtained adhesive copper clad laminates was 610 N/m. Heat-resisting peel strength after being left in the oven at 150° C. for 168 hours was 510 N/m without a considerable change, and hence it was excellent.

The insulation reliability test was conducted with respect to three samples, but a resistance was reduced to $10^6 \Omega$ or below to result in a short-circuit failure in all the samples. On the other hand, all the samples had excellent etching properties.

Additionally, discoloration was observed at many positions on a rear surface of the film in the corrosion resistance test (discoloration on a rear surface of the film after being left in an RH constant-temperature tank at 85° C. and 85% for 1000 hours).

Comparative Example 5

A raw base metal for evaluation was obtained like Example 1 except that a V—Mo—Ni alloy target in which a V ratio is 7 weight % and an Mo ratio is 20 weight % (manufactured by Sumitomo Metal Mining Co., Ltd.) was used as a first layer of a base metal layer to form a film of a V—Mo—Ni alloy base metal layer in which a V ratio is 7 weight % and an Mo ratio is 20 weight % by the direct-current sputtering method, and a sputtering time was changed to a longer time than that in Example 6 to vary a film thickness.

When a film thickness of a part of the film formed under the same conditions was separately measured by a transmission electron microscope (TEM: manufactured by Hitachi Ltd.), it was 53 nm. A lead of 1 mm for the peel strength evaluation and a comb-tooth test piece having a 30 μm pitch for the HHBT were formed from this base material by the subtracting method.

Initial peel strength of the obtained adhesive copper clad laminates was 655 N/m. Heat-resisting peel strength after being left in the oven at 150° C. for 168 hours was 556 N/m without a considerable change, and hence it was excellent.

In an etching test, the base metal layer was not able to be formed by salt iron etching and a lead having a 30 μm pitch failed to be formed in two of three samples.

Moreover, the insulation reliability test was conducted with respect to three samples, but no deterioration was observed in all the samples.

Additionally, no change was observed in the corrosion resistance test (discoloration on a rear surface of the film after being left in an RH constant-temperature tank at 85° C. and 85% for 1000 hours).

Comparative Example 6

A raw base metal for evaluation was obtained like Example 1 except that an Mo—Ni alloy target in which an Mo ratio is 20 weight % (manufactured by Sumitomo Metal Mining Co., Ltd.) was used as a first layer of a base metal layer to form a film of an Mo—Ni alloy base metal layer in which an Mo ratio is 20 weight % by the direct-current sputtering method.

When a film thickness of a part of the film formed under the same conditions was separately measured by a transmission electron microscope (TEM: manufactured by Hitachi Ltd.), it was 20 nm. A lead of 1 mm for the peel strength evaluation and a comb-tooth test piece having a 30 μm pitch for the HHBT were formed from this base material by the subtracting method.

Initial peel strength of the obtained adhesive copper clad laminates was 650 N/m. Heat-resisting peel strength after being left in the oven at 150° C. for 168 hours was greatly reduced to be 320 N/m.

The insulation reliability test was conducted with respect to three samples, but a resistance was reduced to $10^6 \Omega$ or below to result in a short-circuit failure in all the samples. On the other hand, all the samples had excellent etching properties.

Additionally, discoloration was observed at many positions on a rear surface of the film in the corrosion resistance test (discoloration on a rear surface of the film after being left in an RH constant-temperature tank at 85° C. and 85% for 1000 hours).

denum is 5 to 40 weight %, and the balance is nickel and, according to the adhesiveless copper clad laminates of the present invention, a reduction in heat-resisting peel strength can be avoided since vanadium or both vanadium and chrome are contained in the base metal layer, corrosion resistance and

TABLE 1

| | Base metal layer composition (weight %) | | | | | Base metal layer film thickness (nm) | Copper film layer film thickness (μm) | Initial peel strength (N/m) | Heat-resisting peel strength (N/m) | Etching properties | Insulation reliability test | Corrosion resistance test |
|---|---|---|---|---|---|---|---|---|---|---|---|---|
| | V | Cr | Mo | Ni | | | | | | | | |
| Example 1 | 4 | — | 20 | bal. | Alloy target | 20 | 8 | 641 | 533 | Good | Good | Good |
| Example 2 | 13 | — | 20 | bal. | Alloy target | 20 | 8 | 625 | 515 | Good | Good | Good |
| Example 3 | 7 | — | 5 | bal. | Alloy target | 20 | 8 | 670 | 513 | Excellent | Good | Good |
| Example 4 | 7 | — | 40 | bal. | Alloy target | 20 | 8 | 690 | 503 | Excellent | Good | Good |
| Example 5 | 7 | — | 20 | bal. | Alloy target | 3 | 8 | 601 | 533 | Excellent | Good | Good |
| Example 6 | 7 | — | 20 | bal. | Alloy target | 50 | 8 | 608 | 575 | Good | Good | Good |
| Example 7 | 4 | — | 20 | bal. | Alloy target | 20 | 8 Sputtering 1 μm + Electroplating | 615 | 575 | Good | Good | Good |
| Example 8 | 4 | — | 20 | bal. | Alloy target | 20 | 8 Sputtering 8 μm | 628 | 540 | Good | Good | Good |
| Example 9 | 4 | — | 20 | bal. | Alloy target | 20 | 8 Sputtering 500 nm Semi-additive method | 630 | 518 | Good | Good | Good |
| Example 10 | 2 | 2 | 20 | bal. | Alloy target | 20 | 8 | 625 | 541 | Good | Good | Good |
| Example 11 | 4 | — | 20 | bal. | Alloy target | 20 | 8 | 602 | 501 | Good | Good | Good |
| Comparative Example 1 | 3 | — | 20 | bal. | Alloy target | 20 | 8 | 656 | 364 | Excellent | Moderate | Good |
| Comparative Example 2 | 7 | — | 0.5 | bal. | Alloy target | 20 | 8 | 620 | 524 | Good | Moderate | Bad |
| Comparative Example 3 | 7 | — | 44 | bal. | Alloy target | 20 | 8 | 634 | 284 | Good | Good | Good |
| Comparative Example 4 | 7 | — | 20 | bal. | Alloy target | 2 | 8 | 610 | 510 | Good | Bad | Bad |
| Comparative Example 5 | 7 | — | 20 | bal. | Alloy target | 53 | 8 | 655 | 556 | Moderate | Good | Good |
| Comparative Example 6 | 0 | — | 20 | bal. | Alloy target | 20 | 8 | 650 | 320 | Good | Bad | Bad |

INDUSTRIAL APPLICABILITY

As explained above, according to the method for manufacturing adhesiveless copper clad laminates of the present invention, in the adhesiveless copper clad laminates provided by forming the base metal layer directly at least one plane of the insulating film without using an adhesive in between and forming the copper conductor layer having a desired thickness on the base metal layer, the base metal layer having a film thickness of 3 to 50 nm can be formed on the insulating film by the dry plating method and a copper film layer can be formed on the base metal layer, the base metal layer mainly containing (1) a vanadium-molybdenum-nickel alloy in which a vanadium ratio is 4 to 13 weight %, a molybdenum ratio is 5 to 40 weight %, and the balance is nickel and, or (2) a vanadium-chrome-molybdenum-nickel alloy in which a total ratio of vanadium and chrome is 4 to 13 weight % including at least 2 weight % of vanadium, a ratio of molybdenum is 5 to 40 weight %, and the balance is nickel and, according to the adhesiveless copper clad laminates of the present invention, a reduction in heat-resisting peel strength can be avoided since vanadium or both vanadium and chrome are contained in the base metal layer, corrosion resistance and insulation reliability can be improved since molybdenum is also contained, using the adhesiveless copper clad laminates can thereby efficiently obtain a flexible wiring board that has excellent adhesion and corrosion resistance and has a defect-free reliable wiring portion with a narrow width and a narrow pitch, and hence an effect of this adhesiveless copper clad laminates is very large.

The invention claimed is:
1. An adhesiveless copper clad laminate comprising a polyimide insulating film, a base metal layer and a first copper film layer, the base metal layer being directly formed at least on one side of the polyimide insulating film without using an adhesive in between, and then the first copper film layer being formed on the base metal layer,
   wherein the base metal layer has a film thickness of 3 to 50 nm formed by a dry plating method, and the base metal layer consists of a vanadium-molybdenum-nickel alloy consisting of 4 to 13 wt. % of vanadium, 5 to 40 wt. % of molybdenum and a balance of nickel and up to 1 wt. % unavoidable impurities.

2. An adhesiveless copper clad laminate comprising a polyimide insulating film, a base metal layer and a first copper film layer, the base metal layer being directly formed at least on one side of the polyimide insulating film without using an adhesive in between, and then the first copper film layer being formed on the base metal layer, wherein the base metal layer has a film thickness of 3 to 50 nm formed by a dry plating method, and the base metal layer consists of a vanadium-chrome-molybdenum-nickel alloy consisting of at least 2 wt. % of vanadium, 5 to 40 wt. % of molybdenum, chrome and a balance of nickel and up to 1 wt. % unavoidable impurities, the total amount of vanadium and chrome in the alloy being 4 to 13 wt. %.

3. The adhesiveless copper clad laminate according to claim 1, wherein the first copper film layer formed on the base metal layer has a film thickness of 10 nm to 35 μm.

4. A method for manufacturing an adhesiveless copper clad laminate comprising a polyimide insulating film, a base metal layer and a first copper film layer, the base metal layer being directly formed at least on one side of the polyimide insulating film without using an adhesive in between, and then the first copper film layer being formed on the base metal layer, the method comprising: forming the base metal layer with a film thickness of 3 to 50 nm on the polyimide insulating film by a dry plating method, the base metal layer consisting of a vanadium-molybdenum-nickel alloy consisting of 4 to 13 wt. % of vanadium, 5 to 40 wt. % of molybdenum, and a balance of nickel and up to 1 wt. % unavoidable impurities; and forming the first copper film layer on the base metal layer.

5. The method according to claim 4, wherein the first copper film layer is formed by the dry plating method, and then a second copper film layer is further formed on the first copper film layer by a wet plating method.

6. The method according to claim 4, wherein the dry plating method is selected from the group consisting of a vacuum deposition method, a sputtering method, and an ion plating method.

7. A method for manufacturing adhesiveless copper clad laminates comprising a polyimide insulating film, a base metal layer and a first copper film layer, the base metal layer being directly formed at least on one side of the polyimide insulating film without using an adhesive in between, and then the first copper film layer being formed on the base metal layer, the method comprising: forming the base metal layer with a film thickness of 3 to 50 nm on the polyimide insulating film by a dry plating method, the base metal layer consisting of a vanadium-chrome-molybdenum-nickel alloy consisting of at least 2 wt. % of vanadium, 5 to 40 wt. % of molybdenum, chrome, and a balance of nickel and up to 1 wt. % unavoidable impurities, the total amount of vanadium and chrome in the alloy being 4 to 13 wt. %; and forming the first copper film layer on the base metal layer.

* * * * *